Figure 1A:
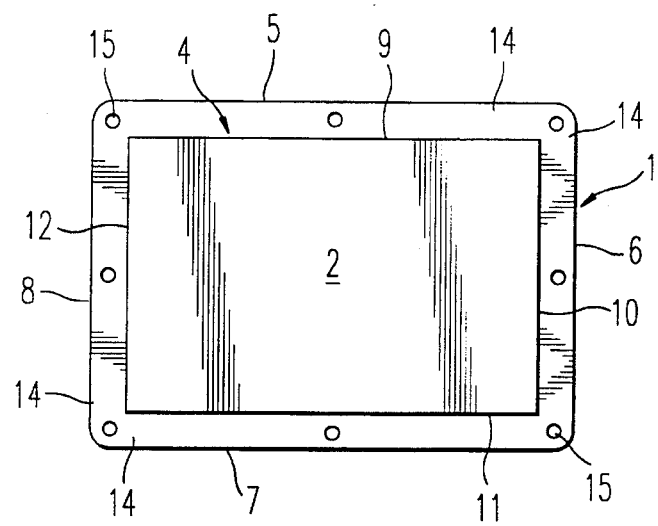

United States Patent [19]
Campet et al.

[11] Patent Number: 5,507,897
[45] Date of Patent: Apr. 16, 1996

[54] PROCESS FOR THE PREPARATION OF A TARGET COMPONENT FOR CATHODE SPUTTERING

[75] Inventors: Guy Campet, Canejan; Maurice Bourrel, Pau; Claude Delmas, Talence; Joesph Portier, Gradignan; Jean Salardenne, Pessac, all of France

[73] Assignee: Societe Nationale Elf Aquitaine, Courbevoie, France

[21] Appl. No.: 244,384

[22] Filed: Jul. 26, 1994

[30] Foreign Application Priority Data

Dec. 13, 1991 [FR] France .................................. 91 15537

[51] Int. Cl.⁶ .......................... C04B 37/00; C04B 35/71; B05D 3/02
[52] U.S. Cl. ................ 156/89; 204/298.12; 204/298.13; 427/193; 427/126.6; 427/376.2; 427/226; 264/60; 264/66; 264/67
[58] Field of Search .................... 204/298.12, 298.13; 264/60, 63, 67, 66; 419/9, 35, 36, 37, 45, 26; 427/226, 189, 193, 26.6, 376.2; 156/89

[56] References Cited

U.S. PATENT DOCUMENTS

| | | | |
|---|---|---|---|
| 4,341,816 | 7/1982 | Lauterbach et al. | 204/298.12 |
| 4,421,628 | 12/1983 | Quaderer | 204/298.12 |
| 4,962,071 | 10/1990 | Bayard | 204/298.13 |
| 5,071,800 | 12/1991 | Iwamoto et al. | 204/298.13 |
| 5,086,351 | 2/1992 | Couput et al. | 204/192.1 |
| 5,091,221 | 2/1992 | Chu et al. | 204/298.13 |
| 5,160,675 | 11/1992 | Iwamoto et al. | 204/298.13 |
| 5,244,556 | 9/1993 | Inoue | 204/192.12 |

FOREIGN PATENT DOCUMENTS 62-243762  10/1987  Japan ................ 204/298.12

*Primary Examiner*—R. Bruce Breneman
*Assistant Examiner*—Rodney G. McDonald
*Attorney, Agent, or Firm*—Oblon, Spivak, McClelland, Maier & Neustadt

[57] ABSTRACT

A target element is formed by creating a precursor system which may yield an inorganic material at a temperature of 300–1600 C. which is lower than the melting point of said material. The precursor system contains an inorganic additive having a melting point no higher than. The precursor system is applied to a support other than a foam or metal felt, the resulting assembly is heated to said temperature and this temperature is maintained for a sufficient time to produce said inorganic material, whereafter the assembly formed by the inorganic material and the support is gradually cooled to room temperature. To produce the target, the target element (2) is bonded to a metal substrate (4) by means of a layer (3) of conductive adhesive.

31 Claims, 1 Drawing Sheet

PROCESS FOR THE PREPARATION OF A TARGET COMPONENT FOR CATHODE SPUTTERING

The invention relates to a process for the preparation of a target component for cathode sputtering. It also relates to the production of targets, especially targets of large area, from this component.

The coating of various materials with thin layers of special properties is currently undergoing considerable development. Special mention may be made of the deposition of anticorrosion coatings on metals, anti reflection coatings on optical glasses or the deposition of ultrahard materials on mechanical components.

Many methods have been proposed for the production of such coatings, the said methods depending, inter alia, on the nature of the compound(s) generating the coating layer. Thus, when the said generating compounds are gaseous, use may be made of various methods of plasma-assisted or unassisted vapour phase chemical deposition. Electrochemical methods can be employed with generating compounds which are liquid or capable of being dissolved if it is a matter of depositing a layer of metal, or else methods such as those known as spin coating or hot spray coating can be employed.

In the case where the source generating the coating is a solid material, the method most widely employed for producing the coating is cathode sputtering. In such a method the solid material which generates the coating, which is generally referred to as "target material" or "target" and which may consist of a metal or a metal alloy or may also consist of an inorganic chemical compound of very high melting point, for example a ceramic or a refractory oxide, is bombarded with ions which have a sufficient energy to eject particles from the target material, the said particles being deposited on the object to be coated, forming the required coating on the latter.

For reasons of uniformity and rate of growth of the deposit formed by the particles ejected from the target material, the area of the said target material to be deposited on the object must be of sufficient size. In the case of the coating of objects of large area, for example window panes, it is thus necessary to employ targets of large area, the area of which is advantageously greater than that of the object to be coated.

While the manufacture of targets of large area from metals or metal alloys does not present problems, this is no longer so when materials of the type of inorganic chemical compounds with a high melting point are involved. In fact, with such materials, the manufacture of the target involves the production of a ceramic or of a sintered product consisting of the said materials. The production of a ceramic or of a sintered product of large area requires the development, step by step, of the most suitable process, such a development being in most cases long, difficult and consequently costly and, what is more, it must necessarily be carried out by an expert.

The invention proposes a simple, fast and inexpensive process for the preparation of a target component for cathode sputtering made of an inorganic material of the ceramic type which has a melting point higher than 300° C. Such a process can be implemented by people who do not have any special skills in the art of ceramics or of sintering and it easily results in target components being obtained which make it possible to produce easily targets of large area.

The process according to the invention for the preparation of a target component for cathodic sputtering made of an inorganic material of the ceramic type which has a melting point higher than 300° C. is characterized in that a precursor system of the inorganic material is formed which is capable of giving rise to the said material at temperatures $\theta$ of between 300° C. and 1600° C. and lower than the melting point of this material, the said precursor system containing at least 20 mol % of an inorganic adjuvant consisting of at least one inorganic compound which has a melting point lower than or equal to the temperature $\theta$ chosen for the production of the inorganic material, a layer of the said precursor system is formed on a support which is substantially inert towards the precursor system and the ceramic inorganic material to be produced and which is thermally and mechanically stable up to temperatures higher than $\theta$, with the exception of a support made of metal foam or felt, the combination of support and precursor system is heated to the temperature $\theta$ chosen for producing the inorganic material, with a rate of temperature rise such as to avoid the formation of dendrites, and the said combination is then maintained at this temperature $\theta$ for a sufficient period to convert the precursor system into the said ceramic inorganic material, and the combination of support and inorganic material is then cooled to return it to ambient temperature, this cooling being carried out so as to avoid any quenching phenomenon.

The inorganic material of the ceramic type forming the target component may be especially a metal oxide, sulphide, halide or oxyhalide whose melting point is higher than 300° C., the said inorganic material being derived from one or more metals which may or may not be transition metals.

In particular, the inorganic material forming the target component may correspond to any one of the formulae $E^k_\alpha Z^p_\beta$ and $M^q_x T^n_y Z^p_z$ in which E denotes at least one metal of groups I to VIII of the Periodic Table of the elements, for example Fe, Cu, Co, Ni, Ti, Cr, Mo, Sn, W and In, M and T denote at least two different metals of groups I to VIII of the said Periodic Table, for example Li, Na, K, Ag, Cu and Tl in the case of M and Ni, Co, W, Mn, Fe, Cr, V and Ti in the case of T, Z is at least one element chosen from oxygen, sulphur, fluorine and chlorine, the symbols k, q, n and p denote the mean oxidation states of the elements E, M, T and Z respectively, $\alpha$ and $\beta$ denote positive integers such that $\alpha k+\beta p=0$ and x, y and z denote positive integers such that $qx+ny+pz=0$.

The term mean oxidation state, applied to each element, expresses the fact that the element in question may have a number of oxidation states in the compound in question.

The inorganic material may be very particularly an oxide and especially an oxide which has any one of the formulae $E^k_\alpha O^{2-}_{\beta 2}$ and $M^q_x T^n_y O^{2-}_z$, in which E is at least one metal of groups I to VIII of the Periodic Table of the elements, for example Fe, Cu, Co, Ni, W, Mo, Ti, Cr, Sn and In, M and T denote at least two different metals of the said Periodic Table, for example Li, Na, K, Ag, Cu and Tl in the case of M and Ni, Co, W, Mn, Cr, Fe, V and Ti in the case of T, the symbols k, q and n denoting the mean oxidation states of E, M and T respectively, $\alpha$ and $\beta$ are positive integers such that $\alpha k-2\beta=0$ and x, y and z denote positive integers such that $qx+ny-2z=0$. As examples of such oxides there may be mentioned, no limitation being implied, $WO_3$, $MoO_3$, $Cr_2O_3$, $TiO_2$, $Fe_2O_3$, $Li_{2-v}NiO_2$ with $0\leq v \leq 1$, $LiCrO_2$, $LiFeO_2$, $LiWO_3$ and $Li_2WO_4$.

The inorganic adjuvant present in the precursor mixture of the inorganic material may be chosen especially from alkali metal, especially sodium, lithium and potassium, halides, in particular fluorides and chlorides, and carbonates. For example, the inorganic adjuvant may consist of one or more compounds such as lithium fluoride, lithium chloride, lithium carbonate, sodium carbonate and potassium carbonate.

The precursor system of the inorganic material advantageously contains between 20 and 80 mol % of the inorganic adjuvant.

The precursor system of the inorganic material may consist of the inorganic material itself, as is the case especially with the abovementioned inorganic materials of formula $E^k_\alpha Z^p_\beta$ and especially with the oxides of formula $E^k_\alpha O^{2-}_\beta$ such as those mentioned above. The precursor system of the inorganic material may also be made up of a mixture of ingredients producing the envisaged inorganic material by chemical reaction at temperatures which are lower than or equal to $\theta$. Thus, when the inorganic material consists of a compound of formula $M^q_x T^n_y Z^p_z$ and especially of an oxide of formula $M^q_x T^n_y O^{2-}_z$, the precursor system of the inorganic material may consist of a mixture, in appropriate proportions, of at least one compound of metal M and at least one compound of metal T, which are capable of forming the compound $M^q_z T^n_y Z^{2-}_z$ or the compound of $M^q_x T^n_y O^{2-}_z$ at the temperature $\theta$. For example, when the inorganic material is an oxide of the formula $M^q_x T^n_y O^{2-}_z$, that is to say a ceramic of the mixed oxide type, the precursor mixture of such an oxide may advantageously consist of a mixture of at least one carbonate of metal M of formula $M^q_x(CO_3)_{qx/2}$ and of at least one oxide of metal T of formula $T^n_y O^{2-}_{ny/2}$. Thus by starting with a precursor system containing equimolecular quantities of $Li_2CO_3$ and NiO, of $Li_2CO_3$ and $Cr_2O_3$, of $Li_2CO_3$ and $Fe_2O_3$ or of $LinCO_3$ and $WO_3$, the ceramic inorganic materials of formulae $Li_2NiO_2$, $LiCrO_2$, $LiFeO_2$ and $Li_2WO_4$ are formed respectively.

When the precursor system contains a mixture of ingredients that react chemically at the temperature $\theta$ to form the envisaged inorganic material and when one of the said ingredients has a melting point lower than or equal to $\theta$, this ingredient may constitute the inorganic adjuvant which must be present in the precursor system of the inorganic material. Thus, when an inorganic material of the mixed oxide type of formula $M^q_x T^n_y O^{2-}_x$, in which M denotes an alkali metal, especially Li, Na or K, is produced from a precursor system containing at least one carbonate of metal M of formula $M^q_x(CO_3)_{qx/2}$ and at least one oxide of metal T of formula $T^n_y O^{2-}_{ny/2}$, the operation being carried out at a temperature $\theta$ between the melting point of the carbonate of metal M and 1600° C., the said carbonate may act as an inorganic adjuvant without a third adjuvant being employed. For example, when an inorganic material of the mixed oxide type of formula $LiT^n_y O^{2-}_z$ is produced from a precursor system containing $Li_2CO_3$ and at least one oxide of metal T of formula $T^n_y O^{2-}_{ny/2}$, the operation being carried out at a temperature $\theta$ between 723° C. and 1600° C., the lithium carbonate of the precursor system may act as inorganic adjuvant without addition of a third adjuvant.

For its application onto the support the precursor system of the inorganic material may be in the form of a powder of appropriate particle size, for example between 5 μm and 200 μm and preferably between 10 μm and 100 μm. In this case the application of the precursor system of the inorganic material onto the support is performed by dusting the said support with the powder.

A coating paste may also be produced by mixing the powder of the precursor system with one or more liquids such as water or an organic liquid or else a gel may be prepared from the pulverulent precursor system according to any one of the conventional sol/gel techniques, and the support may then be coated with the said paste or said gel.

As already indicated, the support onto which the layer of the precursor system of the inorganic material is applied must be substantially inert towards the said material and its precursor system and it must additionally be thermally and mechanically stable, that is to say must maintain its shape without deteriorating, up to temperatures which are higher, for example by at least 50° C., than the temperature $\theta$ chosen for producing the inorganic material.

The support may be especially a support made of a metal or metal alloy such as, for example, platinum, brass, titanium, nickel, copper or stainless steel, with the exception of any support made of metal foam or felt, or else a support made of a ceramic material such as, for example, alumina or titanium oxide.

The use of a smooth support, for example a smooth metal support, makes it possible, when the cooling of the combination of inorganic material and support is finished, to separate the inorganic material forming the target component from the support. On the other hand, when a more or less rough support is employed, the inorganic material remains integrally attached to the support. However, if a nonsmooth support made of an easily machinable substance is employed, for example a friable ceramic substance, the inorganic material forming the target component can be isolated by mechanically separating the said inorganic material from the support and then subjecting to a machining, for example milling, that face of the said inorganic material constituting the target component which was in contact with the support.

The temperature $\theta$ of between 300° C. and 1600° C. and lower than the melting temperature of the inorganic material, which was chosen for producing the said inorganic material from the precursor system containing the inorganic adjuvant, corresponds to a temperature at which the precursor system is converted into the inorganic material by sintering and/or ceramization. The said temperature $\theta$ is preferably chosen between 600° C. and 1200° C.

When the application of the precursor system of the inorganic material onto the support is carried out by coating by means of moist products of the paste or gel type, the combination resulting from the coating of the support with the paste or the gel is advantageously subjected to a drying stage until a substantially dry product is obtained, before the stage of temperature rise to reach the temperature $\theta$ for producing the inorganic material.

When the combination of precursor system and support is heated to the temperature $\theta$ the rate of temperature rise is advantageously between 0.05° C. and 20° C. per minute and it is preferably between 0.1° C. and 10° C.

Similarly, when the combination of inorganic material and support is being cooled from the temperature $\theta$ to ambient temperature, the operation is advantageously carried out with cooling rates ranging from 0.05° C. to 20° C. per minute and more particularly from 0.1° C. to 10° C. per minute.

Maintaining of the combination of precursor system and support at the temperature $\theta$ must take place for a sufficient period to produce a sintered and/or ceramized inorganic material from the precursor system. The said period may be advantageously between 30 minutes and 20 hours.

When it is produced on a nonsmooth support that is difficult to machine, the target component made of the sintered and/or ceramized inorganic material remains adherent to the support and the combination of inorganic material and support which is obtained may be employed directly as a target in a cathode sputtering device.

When it is produced on a friable (easily machinable) nonsmooth support or else on a smooth support, the target component made of the sintered and/or ceramized inorganic material is separated from the support and then adhesively bonded onto a metal substrate, for example a substrate made of brass, titanium, aluminium, copper, tungsten or stainless steel, by means of a thermally and electrically conductive adhesive, to form a target that can be fitted to a cathode sputtering device.

According to the invention it is possible to produce directly a target component of large area, for example of the order of 100 cm² to 1 m², on a nonsmooth support which is difficult to machine and to employ the combination obtained as target of large area. It is also possible to produce a target component of large area on a smooth support or on a friable nonsmooth support, and then, after having separated the target component from the support, to adhesively bond the said component, as indicated above, onto a metal substrate of corresponding area to produce a target of large area.

It is also possible to produce a target of large area by producing target components which have an area smaller than that of the target of large area to be produced, by using a friable nonsmooth support or a smooth support and then, after having separated the target components from their supports, by adhesively bonding, as indicated above, a plurality of the said target components onto a metal substrate of area corresponding to that of the target of large area to be produced, the said target components being arranged adjoiningly on the substrate to cover on this substrate an area corresponding to that desired for the target of large area.

Advantageously, in the case of the targets of small, medium or large area which are obtained by adhesive bonding, carried out as indicated above, of one or more target components onto a metal substrate of appropriate area, the metal substrate has an area whose contour surrounds the contour of the single target component or of the target component resulting from the adjoining juxtaposition of target components of small area, the said contours being preferably parallel to each other so as to define, on that face of the metal substrate onto which the target component(s) is (are) adhesively bonded, a marginal region surrounding the target component. In this marginal region there may emerge orifices passing through the metal substrate and intended for passing securing members, for example screws or the like, allowing the target to be secured onto a supporting member forming part of the cathode sputtering device.

Figure 1B:
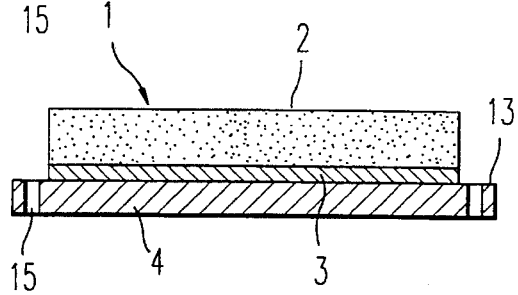
Figure 2A:
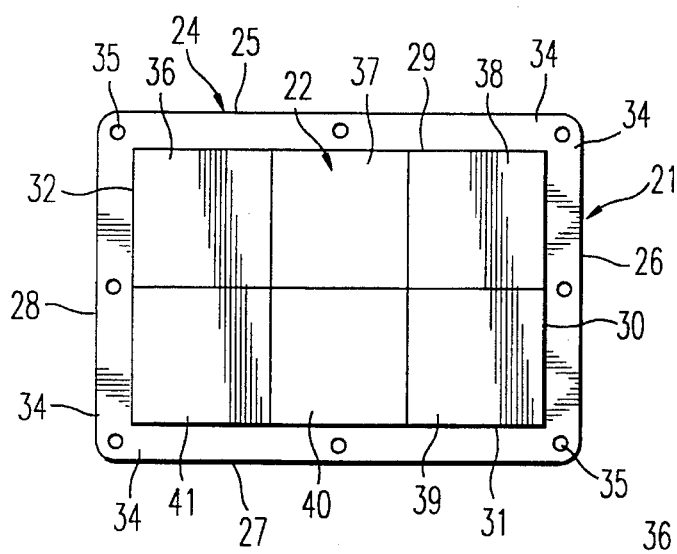
Figure 2B:
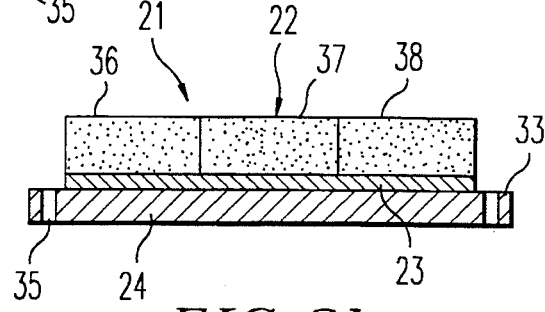

In the attached drawing the FIGS. 1a and 1b show diagrammatically a top view (FIG. 1a) and a lengthwise section (FIG. 1b) of a target of large area obtained from a single target component which has a large area, and FIGS. 2a and 2b show diagrammatically a top view (FIG. 2a) and a lengthwise section (FIG. 2b) of a target of large area obtained from a plurality of target components of smaller area.

With reference to FIGS. 1a and 1b, a target 1 of large area comprises a target component 2 of large area, consisting of an inorganic material obtained by the process of the invention. The target component 2 is in the form of a rectangle which has, for example, a length of 15 cm and a width of 10 cm.

The component 2 is integrally attached by a layer 3 of a thermally and electrically conductive adhesive, for example a two-component conductive epoxy adhesive containing silver, to a metal substrate 4 which has dimensions that are slightly greater than those of the rectangular component 2 so that the contour formed by the edges 5 to 8 of the rectangular metal substrate 4 surrounds the contour formed by the edges 9 to 12 of the rectangular target component 2 and is parallel to it, so as to define a marginal region 14 surrounding the component 2 on the face 13 of the metal substrate onto which the said component 2 is adhesively bonded. In this marginal region there emerge orifices such as 15 passing through the metal substrate and intended as a passage for securing members, for example screws or the like, allowing the target 1 to be fitted onto a support member forming part of the cathode sputtering device.

With reference to FIGS. 2a and 2b, a target 21 of large area comprises a target component 22 of large area, which is in the shape of a rectangle, for example a rectangle 15 cm in length and 10 cm in width, and is produced by the adjoining juxtaposition of six target components 36 to 41, each being in the form of a square, for example of 5 cm side. The target components 36 to 41 which form the target component 22 are integrally attached by a layer 23 of a thermally and electrically conductive adhesive, for example a two-component conductive epoxy adhesive containing silver, to a metal substrate 24 which has dimensions which are slightly greater than those of the rectangular component 22 so that the contour formed by the edges 25 to 28 of the rectangular metal substrate 24 surrounds the contour formed by the edges 29 to 32 of the rectangular component 22 and is parallel to it, so as to define on that face 33 of the metal substrate on which the target components 36 to 41 forming the component 22 are adhesively bonded, a marginal region 34 surrounding the said component 22. In this marginal region there emerge orifices such as 35 passing through the metal substrate and intended as a passage for securing members, for example screws or the like, allowing the target 21 to be fitted onto a support member forming part of a cathode sputtering device. The target components 36 to 41, whose adjoining assembly produces the component 22 of large area are components each of which consists of an inorganic material obtained by the process of the invention making use of a smooth metal support or of a nonsmooth support made of an easily machinable substance.

The invention is illustrated by the following examples, given without any limitation being implied.

EXAMPLE 1

Target component of mixed lithium nickel oxide of composition $LiNiO_2$ and corresponding target A precursor system of the ceramic inorganic material $LiNiO_2$ was formed by placing 7.4 g of lithium carbonate $Li_2CO_3$ and 15.2 g of nickel oxide NiO in a mortar, the said carbonate and oxide being in the form of powders with a particle size of between 10 μm and 100 μm, and by grinding the whole until a homogeneous product was obtained.

A quantity of the pulverulent precursor system capable of forming a layer of powder in the form of a square of 5 cm side and with a thickness of 5 mm was spread, using a template, on a support consisting of a friable ceramic plate made of a coarse-grained alumina, the said plate being in the form of a square of 7 cm side and 5 mm in thickness. The combination of the precursor system and the support was taken from ambient temperature to a temperature θ of 750° C., in atmospheric air, with a rate of temperature rise of 5° C. per minute and was then maintained at the said temperature θ for a period of 8 hours to produce the mixed oxide $LiNiO_2$ from the precursor system. Melting of the lithium carbonate at a temperature of 732° C. causes the precursor system to set solid, and this results in a ceramic inorganic material $LiNiO_2$ of high density being obtained. At the end of the abovementioned eight-hour period, the combination of inorganic material and support was cooled from temperature θ to ambient temperature at a cooling rate of approximately 5° C. per minute.

The ceramic inorganic material $LiNiO_2$ which was obtained adhered to the support. It was parted from it mechanically to form a small plate on one of the faces of which particles of the friable support remained attached.

After the face of the small plate carrying the support particles was machined with a grinding wheel a small plate of ceramic inorganic material $LiNiO_2$ was obtained, forming the target component, the said small plate being in the form of a square of 5 cm side and with a thickness of 4 mm.

The target component obtained as described above was adhesively bonded onto a substrate consisting of a brass plate which was in the form of a square of 7 cm side and with a thickness of 1 mm, with the aid of a two-component conductive epoxy adhesive containing silver, so as to leave visible, on the face of the substrate carrying the target component, a marginal strip 1 cm in width, in which orifices were drilled as a passage for securing members such as screws. A target was then obtained which had a structure similar to that shown diagrammatically in FIGS. 1a and 1b, the said target having a working area (area of the target component) of 25 $cm^2$.

The target thus produced was employed for direct current cathode sputtering for the production—with satisfactory results—of a thin deposit of lithium nickel oxide on a substrate.

EXAMPLE 2

Target components of mixed lithium nickel oxide of composition $LiNiO_2$ and corresponding target of large area By operating as described in Example 1, target components of mixed lithium nickel oxide of composition $LiNiO_2$ were prepared, each having an area of 25 $cm^2$, each of the said components being in the form of a small plate of inorganic material $LiNiO_2$ in the form of a square of 5 cm side and with a thickness of 4 mm.

Six target components obtained were adhesively bonded adjoiningly onto a substrate consisting of an aluminium plate in the form of a rectangle 17 cm in length and 12 cm in width and with a thickness of 1 mm, with the aid of two-component conductive epoxy adhesive containing silver, so as to occupy on the substrate a rectangular area 15 cm in length and 10 cm in width and to leave visible, on the face of the substrate carrying the target components, a marginal strip 1 cm in width, in which orifices were drilled as a passage for securing members such as screws. A target of large area was then obtained which had a structure similar to that shown diagrammatically in FIGS. 2a and 2b, the said target having a working area (area occupied by the combination of the target components) of 150 $cm^2$.

The target thus produced was employed in direct current cathode sputtering to produce—with satisfactory results—a thin deposit of mixed lithium nickel oxide of composition $LiNiO_2$ on a substrate.

EXAMPLE 3

Target component of large area consisting of mixed lithium nickel oxide of composition $LiNiO_2$ and corresponding target A precursor system of the inorganic material $LiNiO_2$ was formed by placing 7.4 parts by weight of $Li_2CO_3$ and 15.2 parts by weight of nickel oxide NiO in a mortar, the said carbonate and oxide being in the form of powders of particle size between 10 µm and 100 µm, and by grinding the whole until a homogeneous product was obtained.

A quantity of the pulverulent precursor system such as to form a layer of powder in the form of a rectangle 15 cm in length and 10 cm in width and with a thickness of 5 mm was spread, using a template, on a support consisting of a smooth-faced brass plate, the said plate being in the form of a rectangle 18 cm in length and 12 cm in width and with a thickness of 1 mm. The combination of the precursor system and support was heated from ambient temperature to a temperature θ of 750° C., in atmospheric air, with a rate of temperature rise of 5° C. per minute, and was then maintained at the said temperature θ for a period of 5 hours to produce the mixed oxide $LiNiO_2$ from the precursor system. Melting of the lithium carbonate at a temperature of 732° C. caused the precursor system to set solid, and this resulted in a ceramic inorganic material $LiNiO_2$ of high density being obtained. At the end of the abovementioned five-hour period, the combination of inorganic material and support was cooled from temperature θ to ambient temperature with a cooling rate of approximately 5° C. per minute.

The ceramic inorganic material $LiNiO_2$ parted easily from the smooth support and a rectangular plate of the ceramic inorganic material $LiNiO_2$ was obtained, forming the target component of large area, the said plate being in the form of a rectangle of 15 cm in length and 10 cm in width and with a thickness of 4 mm.

The target component obtained was adhesively bonded onto a substrate consisting of an aluminium plate in the form of a rectangle 17 cm in length and 12 cm in width and with a thickness of 1 mm, with the aid of a two-component conductive epoxy adhesive containing silver, so as to occupy on the substrate a rectangular area 15 cm in length and 10 cm in width and to leave visible on the face of the substrate carrying the target component, a marginal strip 1 cm in width, in which orifices were drilled as a passage for securing members such as screws. A target of large area which had a structure comparable with that shown diagrammatically in FIGS. 1a and 1b, was thus obtained, the said target having a working area (area occupied by the target component) of 150 $cm^2$.

The target thus produced was employed in direct current cathode sputtering to produce—with satisfactory results—a thin deposit of $LiNiO_2$ mixed oxide on a substrate.

EXAMPLE 4

Target components of mixed lithium tungsten oxide and corresponding target of large area Target components of mixed lithium tungsten oxide were prepared by operating as described in Example 1, but with nickel oxide NiO replaced with the same molar quantity of tungsten oxide $WO_3$.

At the end of the operations, after separation from the support and machining with a grinding wheel, small plates of ceramic inorganic material were obtained consisting of a mixed lithium tungsten oxide and forming target components according to the invention, each small plate being in the form of a square of 5 cm side and with a thickness of 4 mm.

Six target components thus obtained were adhesively bonded as indicated in Example 2 onto a substrate consisting of a rectangular aluminium plate 17 cm in length and 12 cm in width and with a thickness of 1 mm to form a target of large area which had a structure similar to that shown diagrammatically in FIGS. 2a and 2b, the said target having a working area (area occupied by the combination of the target components) of 150 $cm^2$.

The target produced was employed in cathode sputtering to produce—with satisfactory results—a thin deposit of mixed lithium tungsten oxide on a substrate.

EXAMPLE 5

Target component of large area consisting of mixed lithium tungsten oxide and corresponding A target component of large area consisting of mixed lithium tungsten oxide was prepared by operating as described in Example 3, but with nickel oxide NiO replaced with the same molar quantity of tungsten oxide $WO_3$.

At the end of the operations, after separation from the support, a plate of ceramic inorganic material was obtained consisting of a mixed lithium tungsten oxide, the said plate forming a target component of large area according to the invention. This plate was 15 cm in length and 10 cm in width with a thickness of 4 mm.

The target component of large area which was obtained was adhesively bonded as described in Example 3 onto a substrate consisting of a rectangular aluminium plate 17 cm in length and 12 cm in width and with a thickness of 1 mm to form a target of large area which had a structure similar to that shown diagrammatically in FIGS. 1a and 1b, the said target having a working area (area occupied by the target component) of 150 $cm^2$.

The target thus produced was employed in cathode sputtering to produce—with satisfactory results—a thin deposit of mixed lithium tungsten oxide on a substrate.

We claim:

1. A process for the preparation of a target component for cathode sputtering comprising an inorganic ceramic material which has a melting point higher than 300° C., consisting essentially of:
   a) providing a precursor system of the inorganic ceramic material which is capable of generating said inorganic ceramic material at temperatures θ of between 300° C. and 1600° C. and lower than the melting point of said inorganic ceramic material, said precursor system containing at least 20 mol % of an inorganic adjuvant consisting of at least an inorganic compound which has a melting point lower than or equal to the temperature θ chosen for the production of the inorganic ceramic material and which is selected from the group consisting of alkali metal halides and alkali metal carbonates;
   b) forming a layer of said precursor system on a support which is substantially inert towards the precursor system and the inorganic ceramic material to be produced and which is thermally and mechanically stable up to temperatures higher than θ, with the proviso that said support is not made of a metal foam or metal felt;
   c) heating the combination of support and precursor system to the temperature θ chosen for producing the inorganic ceramic material, said heating being performed at a rate of temperature rise between 0.05° C. and 20° C. per minute such as to avoid the formation of dendrites;
   d) maintaining the heated combination of support and precursor system at said temperature θ until the precursor system is converted into the inorganic ceramic material; and
   e) cooling the combination of support and inorganic ceramic material to return both the support and inorganic ceramic material to ambient temperature, this cooling being carried out at a cooling rate ranging from 0.05° C. to 20° C. per minute so as to avoid any quenching phenomenon.

2. The process according to claim 1, wherein the inorganic ceramic material to be produced is a metal oxide, sulphide, halide or oxyhalide whose melting point is higher than 300° C., said inorganic ceramic material being derived from one or more metals.

3. The process according to claim 2, wherein the inorganic ceramic material has the formula $E_\alpha^k Z_\beta^p$ or $M_x^q T_y^n Z_z^p$, in which E is at least one metal selected from the group consisting of Fe, Cu, Co, Ni, Ti, Cr, Mo, W, Sn and In, M is a metal selected from the group consisting of Li, Na, K, Ag, Cu and Tl, T is a metal selected from the group consisting of Ni, Co, W, Mn, Fe, Cr, V and Ti, Z is at least one element selected from the group consisting of oxygen, sulphur, fluorine and chlorine, the symbols k, q, n and p denote the average oxidation states of the elements E, M, T and Z, respectively, α and β are positive integers such that αk+βp=0 and x, y and z are positive integers such that qx+ny+pz=0.

4. The process according to claim 2, wherein the inorganic ceramic material is an oxide having the formula $E_\alpha^k O_\beta^{2-}$ or $M_x^q T_y^n O_z^{2-}$, in which E is at least one metal selected from the group consisting of Fe, Cu, Co, Ni, W, Mo, Ti, Cr, Sn and In, M is a metal selected from the group consisting of Li, Na, K Ag, Cu and Tl, T is a metal selected from the group consisting of Ni, Co, W, Mn, Cr, Fe, V and Ti, the symbols k, q and n denote the average oxidation states of E, M and T, respectively, α and β are positive integers such that αk−2β=0 and x, y and z are positive integers such that qx+ny−2z=0.

5. The process according to claim 1, wherein the inorganic ceramic material is present in the precursor system.

6. The process according to claim 3, wherein the inorganic ceramic material corresponds to the formula $E_\alpha^k Z_\beta^p$ and wherein the precursor system contains said inorganic material.

7. The process according to claim 4, wherein the ceramic inorganic material corresponds to the formula $E_\alpha^k O_\beta^{2-}$ and wherein the precursor system contains said inorganic ceramic material.

8. The process according to claim 1, wherein the precursor system of the inorganic ceramic material is made up of a mixture of ingredients producing the inorganic ceramic material by chemical reaction at temperatures lower than or equal to the temperature θ.

9. The process according to claim 3, wherein the inorganic ceramic material has the formula $M_x^q T_y^n Z_z^p$ and wherein the precursor system of the inorganic ceramic material consists of a mixture containing at least one compound of metal M and at least one compound of metal T, which are capable of forming the inorganic ceramic material $M_x^q T_y^n Z_z^p$ at the temperature θ.

10. The process according to claim 4, wherein the inorganic ceramic material corresponds to the formula $M_x^q T_y^n O_z^{2-}$ and wherein the precursor system of the inorganic ceramic material consists of a mixture containing at least one compound of metal M and at least one compound of metal T, which are capable of forming the inorganic ceramic material $M_x^q T_y^n O_z^{2-}$ at the temperature θ.

11. The process according to claim 10, wherein the precursor system of the inorganic material consists of a mixture containing at least one carbonate of metal M of formula $M_{x'}^q (CO_3)^{2-}_{qx'/2}$ and at least one oxide of metal T of formula $T_{y'}^n O^{2-}_{ny'/2}$ wherein x' and y' are positive integers such that qx'−2qx'/2=0 and such that ny'−2ny'/2=0.

12. The process according to claim 1, wherein the inorganic ceramic adjuvant is selected from the group consisting of lithium fluoride, lithium chloride, lithium carbonate, sodium fluoride, sodium chloride, sodium carbonate, potassium fluoride, potassium chloride and potassium carbonate.

13. The process according to claim 1, wherein the precursor system contains a mixture of ingredients reacting chemically at the temperature θ to form the inorganic ceramic material and wherein one of said ingredients has a melting temperature lower or equal to θ and constitutes the inorganic adjuvant present in the precursor system.

14. The process according to claim 11, wherein the precursor system of the inorganic ceramic material consist of a mixture comprised of a least one carbonate of metal M of formula $M_x^q(CO_3)^{2-}_{qx/2}$ with M being an alkali metal and of at least one oxide of metal T of formula $T_y^n O_{ny/2}^{2-}$, said carbonate constituting the inorganic adjuvant present in the precursor system and wherein the temperature θ is between the melting point of the carbonate of metal M and 1600° C.

15. The process according to claim 14, wherein the carbonate of the precursor system is lithium carbonate $Li_2CO_3$ and wherein the temperature θ is between 723° C. and 1600° C.

16. The process according to claim 1, wherein the precursor system of the inorganic ceramic material contains between 20 mol % and 80 mol % of the inorganic adjuvant.

17. The process according to claim 1, wherein the precursor system of the inorganic ceramic material is in the form of a powder and wherein the precursor system is applied onto the support by dusting said support with said powder.

18. The process according to claim 1, wherein the precursor system of the inorganic ceramic material is in the form of a paste for coating or in the form of a gel and wherein the precursor system is applied onto the support by coating said support with said paste or said gel.

19. The process according to claim 18, wherein the coated support is subjected to a drying stage before the stage of temperature rise to reach the temperature θ.

20. The process according to claim 1, wherein the temperature θ, which is chosen for producing the inorganic ceramic material from the precursor system containing the inorganic adjuvant is between 600° C. and 1200° C.

21. The process according to claim 1, wherein said rate of temperature rise is between 0.1° C. and 10° C. per minute.

22. The process according to claim 1, wherein the period of maintaining the combination of precursor system and support at the temperature θ is between 30 minutes and 20 hours.

23. The process according to claim 1, wherein said cooling rate ranges from 0.1° C. to 10° C. per minute.

24. The process according to claim 1, wherein the support employed is a metallic support or a ceramic support, with the proviso that the metallic support is not made of a metal foam or felt.

25. The process according to claim 24, wherein said metallic support is made of platinum, brass, titanium, nickel, copper or stainless steel.

26. The process according to claim 1, wherein the inorganic ceramic material constituting the target component is separated from the support.

27. The process according to claim 1, wherein a support made of a machinable material is employed and wherein the inorganic ceramic material constituting the target component is separated mechanically from the support and the face of said target component which was in contact with the support is subjected to machining.

28. The process according to claim 1, wherein the support is so selected that the inorganic ceramic material remains integrally attached to said support to form a supported target component constituting a target for cathode sputtering.

29. The process according to claim 26 or claim 27, wherein at least one target component is adhesively bonded onto a metal substrate by means of a thermally and electrically conductive adhesive to thereby form a target for cathode sputtering.

30. The process according to claim 26 or claim 27, wherein a target component having an area ranging from about 100 cm² to about 1 m², is produced and wherein said target component is adhesively bonded onto a metal substrate of corresponding area by means of a thermally and electrically conductive adhesive to thereby form a target for cathode sputtering.

31. The process according to claim 26 or claim 27, comprising producing target components, each having an area smaller than an area of from about 100 cm² to about 1 m² and adhesively bonding a plurality of said target components by means of a thermally and electrically conductive adhesive onto a metal substrate of an area of from about 100 cm² to about 1 m² in such a way that said target components of said plurality are arranged connectively on the said metal substrate to cover on this substrate an area corresponding to an area of from about 100 cm² to about 1 m², to thereby form a target for cathode sputtering.

* * * * *

UNITED STATES PATENT AND TRADEMARK OFFICE
CERTIFICATE OF CORRECTION

PATENT NO.  : 5,507,897
DATED       : April 16, 1996
INVENTOR(S) : Guy CAMPET, et al.

It is certified that error appears in the above-indentified patent and that said Letters Patent is hereby corrected as shown below:

On the title page, please delete Item [22]; Items [22], [86], and [87], the PCT Information, should read:

```
--[22] PCT Filed:        Dec. 11, 1992

[86] PCT No:           PCT/FR92/01172
       §371 Date:        July 26, 1994
       §102 Date:        July 26, 1994

[87] PCT Pub. No:      WO93/12264
       PCT Pub. Date:    June 24, 1993--
```

Signed and Sealed this

Thirtieth Day of July, 1996

BRUCE LEHMAN

*Attest:*

*Attesting Officer*    *Commissioner of Patents and Trademarks*